(12) United States Patent
Jensen

(10) Patent No.: US 7,890,914 B2
(45) Date of Patent: Feb. 15, 2011

(54) LAYOUT DATA REDUCTION FOR USE WITH ELECTRONIC DESIGN AUTOMATION TOOLS

(75) Inventor: Lance Christopher Jensen, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 209 days.

(21) Appl. No.: 12/024,264

(22) Filed: Feb. 1, 2008

(65) Prior Publication Data

US 2009/0199147 A1    Aug. 6, 2009

(51) Int. Cl.
    *G06F 17/50* (2006.01)
(52) U.S. Cl. ................. 716/110; 716/103; 716/120
(58) Field of Classification Search .......... 716/103, 716/110, 120
    See application file for complete search history.

(56) References Cited

U.S. PATENT DOCUMENTS

| | | | | |
|---|---|---|---|---|
| 5,030,907 A | * | 7/1991 | Yih et al. ............... | 324/754 |
| 6,096,093 A | * | 8/2000 | Caywood et al. ........ | 716/21 |
| 6,154,714 A | * | 11/2000 | Lepejian ................ | 702/118 |
| 6,185,707 B1 | * | 2/2001 | Smith et al. ............ | 714/724 |
| 6,941,530 B2 | * | 9/2005 | Joshi et al. ............. | 716/4 |
| 7,240,316 B2 | | 7/2007 | Regnier | |
| 7,257,507 B1 | * | 8/2007 | Suri et al. .............. | 702/117 |
| 7,530,034 B2 | * | 5/2009 | Betz et al. .............. | 716/1 |
| 7,539,966 B2 | * | 5/2009 | Basu et al. ............. | 716/11 |
| 2007/0230770 A1 | * | 10/2007 | Kulkarni et al. ......... | 382/149 |

FOREIGN PATENT DOCUMENTS

| | | | | |
|---|---|---|---|---|
| JP | 04034949 A | * | 2/1992 | |
| JP | 04290241 A | * | 10/1992 | |
| JP | 04319987 A | * | 11/1992 | |

* cited by examiner

*Primary Examiner*—Naum B Levin
(74) *Attorney, Agent, or Firm*—Warren L. Franz; Wade J. Brady, III; Frederick J. Telecky, Jr.

(57) ABSTRACT

A system and method which stores a three dimensional physical representation of an electrical circuit such as an integrated circuit design uses a database having a plurality of files to store active trace data and inactive feature data (layout data). The data from each file can be cross mapped with schematic data. A netlist or some other correlation method can be used to correlate the data from each of the individual files such that the leads of the layout data are correlated to leads from a schematic to maintain compatibility between the netlist and the layout data. Segmenting data into individual files decreases load times while correlating data with the netlist ensures electrical data is valid and suitable for characterization and optimization of the layout data. Various other embodiments are also described.

8 Claims, 3 Drawing Sheets

LAYOUT DATA REDUCTION FOR USE WITH ELECTRONIC DESIGN AUTOMATION TOOLS

FIELD OF THE INVENTION

This invention relates the field of integrated circuit design, and more particularly to software tools used in electronic design automation.

BACKGROUND OF THE INVENTION

Designing integrated circuit (IC) devices such as microprocessors, memory devices, logic devices, radio frequency identification (RFID) tags, etc. can be performed though the use of computer aided design (CAD) software tools. CAD tools and other electronic design automation (EDA) tools are used for all stages of integrated circuit design, from production of the initial circuit design schematic, to electrical simulation of the circuit design to verify proper functionality, conversion of the circuit schematic into a three dimensional physical translation or graphical representation of the schematic devices, verification that the physical device translation is analogous to the circuit design and will provide a functioning device, failure analysis, and optimization of circuit and physical designs to ensure device reliability, stability, and manufacturability.

Design and viewing tools from several different vendors are currently used in the semiconductor industry, including Cadence® (Cadence Design Systems. Inc., San Jose, Calif.), Knights Camelot™ (Magma® Design Automation, San Jose, Calif.), and Spice (SiSoft, Maynard, Mass.), as well as many other design and viewing environments.

The quantity of data required to provide electrical and graphical representation information for each integrated circuit device has increased exponentially as devices have become more complex. A database for each IC device design requires several types of data, each of which contributes to a varying degree to the size of the database.

For example, each device database requires a schematic, which is a symbolic representation of each circuit element (transistors, resistors, capacitors, etc.) of an electrical circuit.

Additionally, each design device database requires a netlist ("logical schematic") or some other system of storing the schematic connectivity information that can be related to a layout. A netlist is a text list of electrical signals which pertain to the electrical design schematic and to all of the circuit elements which are connected to each signal in the design. The netlist, for example, correlates the leads of the electrical design schematic to the leads depicted in the layout (discussed below). The netlist data can be stored in a verilog file and is used during translation of the schematic data into the layout using a place-and-route tool.

Each device database also requires active trace data, which is a three dimensional physical translation or graphical representation of the active electrical devices from the schematic into a physical depiction of each element of the circuit. The various circuit elements are depicted using a large number of polygon shapes. The active trace data, for example, will depict polysilicon gates, metal lines, implanted semiconductor regions, conductive leads, etc. which form each circuit element of the schematic. This data can be stored in a .gds file ("Graphic Design System" file, a file having a ".gds" extension), in a file having a ".laff" or ".oasis" extension, or in one or more files having some other extension depending on the EDA vendor. Various electrical points of the active trace data are cross referenced to the schematic by the listings in the netlist.

Additionally, each device database requires graphical data pertaining to inactive ("dummy fill") features, which are typically conductive features which are not active electrically in the circuit but which are used to improve IC device manufacturability. They must be included in the database information so that the positions of functional (active trace) features relative to the positions of the dummy features can be considered to prevent shorts and other interference. As with the functional features, the dummy fill features are represented by polygons. Many of these dummy fill features are complete and identical, and therefore one single polygon instance can be used to define all of the complete dummy fill polygons. However, during production of the layout, an active feature can intersect one of these inactive dummy features. Because the dummy fill features are conductive, they can cause an electrical short or other interference with active features. To prevent interference, the dummy feature shape must be truncated to maintain a specified minimum distance or "critical dimension" between the active feature and the dummy feature. Truncation results in a polygon which does not have the complete polygon shape, thus a separate polygon instance of each different truncated dummy fill polygon must be stored, which further increases the size of the database. Dummy fill data can be stored in files having extensions similar to the active trace data files.

Because active trace data and dummy fill data are often incorporated into the same file, the term "layout data" as used herein may include both functional feature (active trace) data and inactive feature (dummy fill) data unless otherwise noted.

With increasing device complexity, database sizes for cutting edge designs continue to increase at a rate faster than the development of hardware which is able to quickly manage the data. Layout data excluding dummy fill and electrical data can currently approach and exceed 50 gigabytes (GB), requiring several hours to load into memory of a viewer in order to display. Engineers and technicians must load this data to review design and electrical data pertaining to operation of the IC design, correct errors, alter the layout to optimize electrical performance and manufacturability, etc. All active trace, dummy fill, and electrical data must be loaded by a computer each time the device is to be reviewed or modified to determine whether modifications will affect upstream and downstream circuits and structures, and structures on different physical levels either above or below the modified structure. Loading all the layout and electrical data is necessary so that device performance can be monitored as the circuits or structures are modified to ensure a functional and reliable IC device.

Loading the large amount of data in device design databases into a viewer can require several hours, and frequent hardware upgrades are needed to improve data handling performance. Both the long load times and frequent hardware upgrades add to the cost of device production.

A method which improves semiconductor device design data handling to reduce the time required to load the data into viewer memory in order to display would decrease costs by extending the useful lifetime of hardware and would therefore be desirable.

SUMMARY OF THE INVENTION

A first embodiment of a system which stores layout data for use in optimizing and/or viewing an electrical circuit comprises a layout depicting a three dimensional physical representation of an electrical circuit schematic. The layout is stored in a plurality of layout data files, with each layout data file storing a different segment of the layout. The system is adapted to access each layout data file from the plurality of layout data files individually, while a remainder of the plurality of layout data files remains unaccessed. Each layout data file maintains a file organization such that electrical data pertinent to the electrical circuit remains valid for each layout data file as it is individually accessed.

A second embodiment of a system which stores and displays a semiconductor device design comprises layout data and a viewer which displays the layout data. The system is configured to load only a first portion of the layout data into the viewer for display and a second portion of the layout data remains unloaded by the system into the viewer while electrical data pertaining to the operation of the semiconductor device design loaded with the first portion of the layout data remains valid.

In another embodiment, a method is used to provide semiconductor device design data for viewing. The method comprises providing a schematic of a semiconductor device design, the schematic having a plurality of schematic devices. Also provided is a netlist, and a single layout data file comprising a three dimensional physical translation of the plurality of schematic devices of the semiconductor device design. The three dimensional physical translation comprises a grid pitch, an offset of polygon structures, and a hierarchy. The single layout data file is divided into a plurality of individual layout data files, wherein each individual layout data file comprises only a portion of the three dimensional physical translation. Data of the plurality of individual layout data files is correlated such that the grid pitch and the offset of polygon structures are maintained subsequent to the data correlation. Each individual layout data file is cross mapped with the netlist to correlate leads of the three dimensional physical translation associated with each individual layout data file to leads of the schematic devices. Finally, at least one, but less than all, of the plurality of individual layout data files is accessed while a remainder of the plurality of individual layout data files remains unaccessed to view the accessed individual layout data files.

A fourth embodiment is an electronic design automation (EDA) system which stores an electrical circuit layout and comprises a first data file storing electrical data, a second data file storing a three dimensional physical representation of the electrical circuit, and a viewer for displaying the three dimensional physical representation of the electrical circuit. The system is adapted to load only a first portion of the three dimensional physical representation of the electrical circuit into viewer memory for display, while a second portion of the three dimensional physical representation of the electrical circuit is not loaded into viewer memory for display. During viewing, electrical data of the first data file remains valid for the first portion of the three dimensional physical representation of the electrical circuit.

BRIEF DESCRIPTION OF THE DRAWINGS

The accompanying drawings, which are incorporated in and constitute a part of this specification, illustrate embodiments of the invention and together with the description, serve to explain the principles of the invention. In the figures.

DESCRIPTION OF THE EMBODIMENTS

Reference will now be made in detail to the present embodiment of the invention, an example of which is illustrated in the accompanying drawings. Wherever possible, the same reference numbers will be used throughout the drawings to refer to the same or like parts.

When working with an IC device design database, an engineer or technician might be interested in only a small part of the layout, for example to characterize or improve electrical performance of only one section of an IC device. With prior procedures, depending on the function being performed on the circuit layout, the entire database, including all schematic, netlist ("logical schematic"), active trace, and dummy fill data must to be loaded into memory to ensure that the effect of any electrical or structural modification can be considered. This requires considerable time and frequent hardware upgrades to minimize load times with ever increasing database sizes.

In accordance with one embodiment of the invention, a database is provided which allows active trace and dummy fill data from a particular area of interest of the IC device to be loaded (accessed) into memory and modified, while layout data representing other areas of the device is not loaded. In addition, even though all the layout data is not accessed, the schematic and netlist data for the loaded IC device area remains valid. This allows circuit simulation or viewing of electrical connectivity even though only a part of the layout information is loaded.

Figure 1:
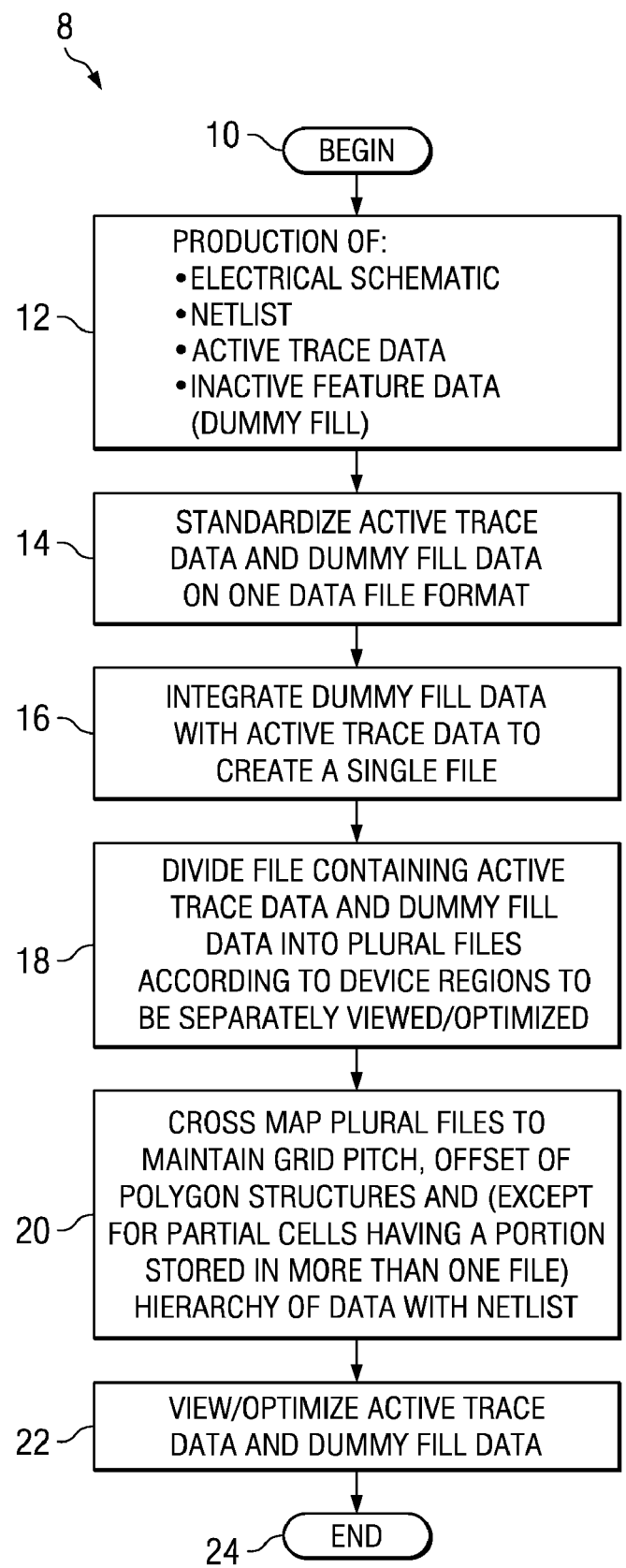
FIG. 1 is a flow chart depicting a methodology to practice a first embodiment of the invention.

FIG. 1 is a flow chart depicting a methodology 8 for implementing a first embodiment of the present invention.

The process of the first embodiment begins 10 with the production of the electrical schematic, netlist, active trace (functional feature) data, and inactive feature (dummy fill) data 12 in accordance with prior techniques.

Dummy fill data and active trace data can be produced in various file types. If the two file types are not directly combinable, the active trace data and dummy fill data are standardized on one file format 14. For example, each of the active trace data and dummy fill data can be converted into a separate gds file.

Subsequently, the inactive feature data can be integrated with the active trace data 16. That is, the dummy fill and active trace data are combined into one file, such as a .gds file.

Next, the dummy fill data and active trace data can be divided or cropped into plural discrete files 18. Each separate file will contain only a portion of the dummy fill and active trace data, with all data being represented within one of the segmented files. Other data pertinent to the file, for example data regarding the relative position of the layout data contained in the file to the device design, which can be stored with respect to an origin, can also be stored in each file. With current EDA design software from specific vendors, a number of different files having a ".gds" extension can be produced.

Various criteria can be used to divide the active trace and dummy fill data into individual files. By way of example only, data division might be based on which areas of the device, as a whole, would likely be of interest as a separate unit during the life of the IC design. This can include the division of the data into areas which may fully contain one design module and part of a neighboring design module.

Increasing the number of discrete files generated at this point decreases the amount of data which must be loaded into the viewer memory of an electronic system such as a computer. Because less data must be loaded, the time to load the data also decreases. The size of the physical area of the IC device represented by each file should be sufficiently large, however, that loading additional files to view adjacent IC device areas of interest is minimized.

Division of the active trace and dummy fill data into a plurality of files can be performed using a software change implemented by the EDA vendor. For example, the cropping of data into separate files can be performed using a "window" function on Beta PVS software available from Cadence Design Systems, Inc. (San Jose, Calif.).

After dividing the data into plural individual files 18, the data from each file can be cross mapped with each of the other files such that the grid pitch and the offset of polygon structures of the active trace and dummy fill data can be maintained 20. The hierarchy of the active trace and dummy fill data will also be maintained where possible to reduce draw time, but may be altered if a region of interest crosses a partial cell placement (i.e. crosses a cell boundary). A cell can be cropped if the area of interest stops part way across a cell, as data for only a portion of the cell will be stored in a file and the remainder of the cell will be stored in a different file. Thus data for each portion of a cropped cell will be stored in separate files which will alter the hierarchy by redefining each partial cell, as each cell portion of a partial cell stored in more than one file must be redefined for each file. The grid pitch and offset are maintained in the original file format, for example in a ".gds" file format. The coordinate space and the grid pitch for the correlated data from the individual files should remain the same as they were when a single file contained both the active trace and dummy fill data. The netlist can be used to correlate the data from each of the individual files such that the leads of the layout are correlated to the schematic leads to maintain compatibility between the netlist and the layout data. The grid pitch and hierarchy (except for partial cells divided into more than one file) can be maintained by defining them in the same location with the same grid pitch in a new file. For example, during step 20 the .gds data is conditioned so that it will function with a normal cross mapping flow. One method of doing this is to send a subset of the layout data to be cross mapped with the full schematic. That is, the cross mapping files correlate a netlist lead location in the layout (x, y location) to a net name from the schematic (an alphanumeric tag which references other tags with connectivity information). During the process of step 20, the spatial location does not change, as undesired information is removed to create a file with information of interest. The spatial location can be maintained so that the netlist which includes the logical connectivity of a design can be associated to the layout. The layout information can be conditioned so that it can be correlated to the netlist, and is split such that the layout file cross maps normally with the netlist data. The netlist can be used to relate to the transistor level schematic components. In this way, layout information which is not required can be removed while maintaining the functionality of the design environment.

Successful correlation of the netlist to the layout data can be determined by manual inspection by performing a cut cross-mapped layout flow as described in this document followed by a net trace on the net. A cropped layout vs. non-cropped layout comparison can be made with common layout vs. schematic (LVS) tools on the polygon structures using "XOR" functionality. If the layout is defective, polygon structures will exist in the region of interest, but if layout is successful, no polygons will exist in the region of interest.

After cross mapping, the data from each individual file can be loaded separately into the viewer so that viewing and, if necessary, optimization 22 of the information can be performed, where this embodiment of the invention ends 24. Because the netlist has been used to correlate the data from the previous step, the electrical information remains valid. Thus only a portion of the active trace and dummy fill data can be loaded into memory for viewing and modification, while electrical data pertaining to the operation of the IC design loaded with the active trace and dummy fill data remains valid.

By way of example only, when using EDA tools available from Magma Design Automation (San Jose, Calif.), a set of layout files (k_cell.db, k_inst.db, k_object.db, and k_string.db), a set of netlist files (k_net.db, k_net_index.db, k_sch_hash.db, k_sch_test.db, and k_sch_text_index.db) and a set of cross mapping files (k_MAP.000, k_MAP.001, k_MAP.002, etc., k_map_cell.db, k_map_ft.tbl, k_map_inst.tbl, k_map_instinfo.db, k_map_net.tbl, k_map_netbound.db, and k_map_string.db) remain. When using automated test equipment (ATE) software from Credence Systems Corporation (Milpitas, Calif.), a set of files will remain after completion of this embodiment. The file set comprises at least three files, a "LEF" file, a "DEF" file, and at least one ".gds" file.

The ability to load only the data corresponding to the IC device area of interest reduces the amount of data and decreases the load time. For example, an IC device database which is 50 GB in size might require only 800 MB of information to be loaded to view the IC device area of interest while maintaining the integrity of the electrical data associated with the layout. Prior EDA tools require loading of the netlist and the entire active trace and dummy fill files from the database to analyze or modify only one portion of the IC design, for example because electrical data was valid only when loading the entire database.

Figure 2:
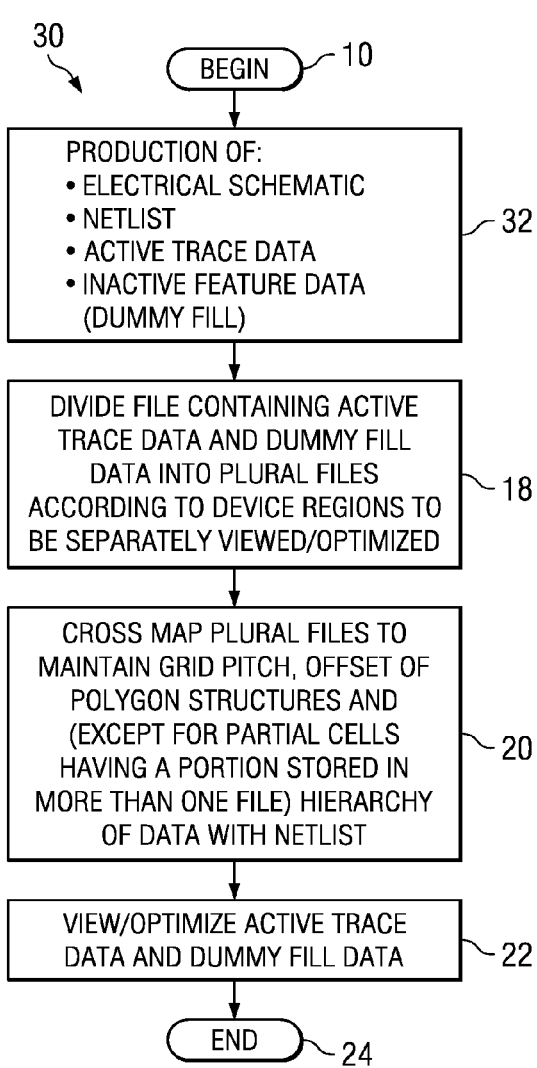
FIG. 2 is a flow chart depicting a methodology to practice a second embodiment of the invention.

FIG. 2 depicts a second embodiment of the invention 30. Process 30 begins 10 with the production of the electrical schematic, netlist, active trace data, and dummy fill data 32. During this initial phase 32, production of the active trace data and dummy fill data results in a single file so that standardization of file types and integration into a single file of the previous embodiment are not necessary.

After production of the four data sets listed at 32, with the active trace data set and the dummy fill data set being produced within a single file, the dummy fill and active trace data can be divided into plural discrete files 18. As with the previous embodiment, each separate file will contain only a portion of the dummy fill and active trace data, with all data being represented within at least one of the segmented files. It is possible that other data will be stored in the file, for example the position of active trace data stored in the file relative to the IC device layout.

Subsequently, the data from each file can be cross mapped with each of the other files such that the grid pitch, the offset of polygon structures and, except for partial cells divided into more than one file as discussed above, the hierarchy of the dummy fill and active trace data is maintained 20, for example in accordance with the procedures of the first embodiment. Thus the data can be viewed and optimized 22, and the process 30 ends 24.

Figure 3:
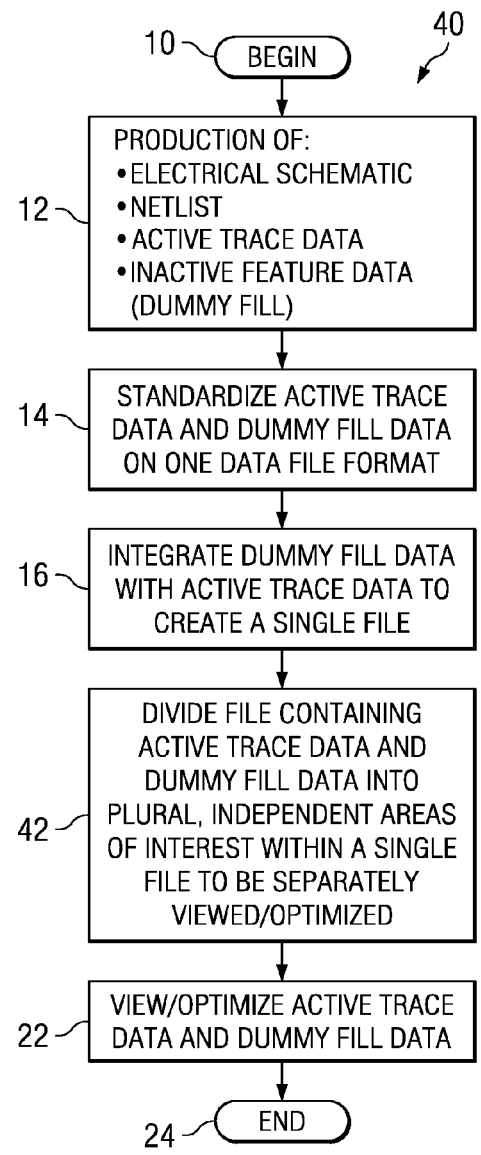
FIG. 3 is a flow chart depicting a methodology to practice a third embodiment of the invention.

FIG. 3 depicts a third embodiment of the invention 40. This process begins 10 with the production of the electrical schematic, netlist, active trace data, and dummy fill data 12 in accordance with the first embodiment. In this embodiment, the dummy fill and active trace data are produced in separate files, although it should be noted that this embodiment can be easily modified by one of ordinary skill in the art for active trace and dummy fill data produced in a single file containing all layout data as with the second embodiment.

As with the first embodiment, the dummy fill and active trace data are standardized on one file format 14. Subsequently, the dummy fill and active trace data are combined into one file 16. Next, the file containing the active trace and dummy fill data can be divided into plural, independent areas of interest within a single file which, in many cases, will be separately loaded then viewed and optimized 42. This embodiment can be implemented using a system of coordinates which define viewable areas of interest that are input to load only a specific region of the active trace and dummy fill data, while the electrical data remains valid for the device. Because only a portion of the active trace data and dummy fill data can be loaded into viewer memory, the demand on the hardware can be decreased along with the time required to load the data. As with previous embodiments, the data can be then viewed and/or optimized 22, where the embodiment ends 24.

Figure 4:
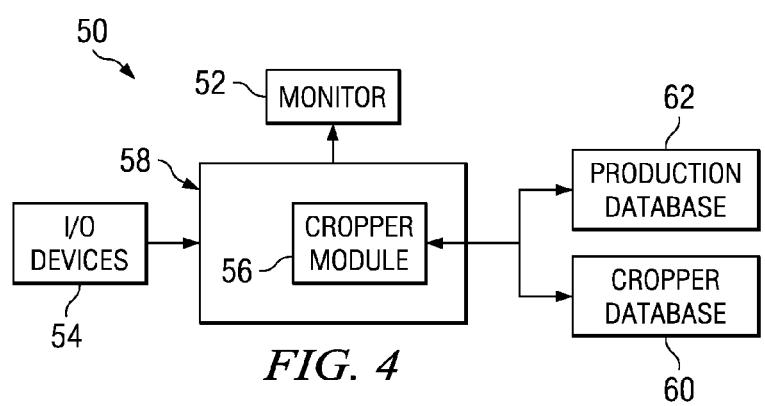
FIG. 4 is a schematic view of a system comprising an embodiment of the invention.

FIG. 4 depicts a system 50 comprising an embodiment of the invention. FIG. 4 depicts a computer system comprising a computer monitor 52, input/output (I/O) devices 54, and a central processing unit (CPU) or processor 58. A cropper module 56 as part of an overall software system executed by the CPU 58 as previously described performs the data manipulation detailed above and stores the divided active trace data and dummy fill data in a memory as a cropper database 60. A production database 62 also stored in memory supplies needed information to the cropper module during division of the active trace data and dummy fill data into plural, independent areas of interest, and may further receive information from either the cropper module or the cropper database.

Figure 5:
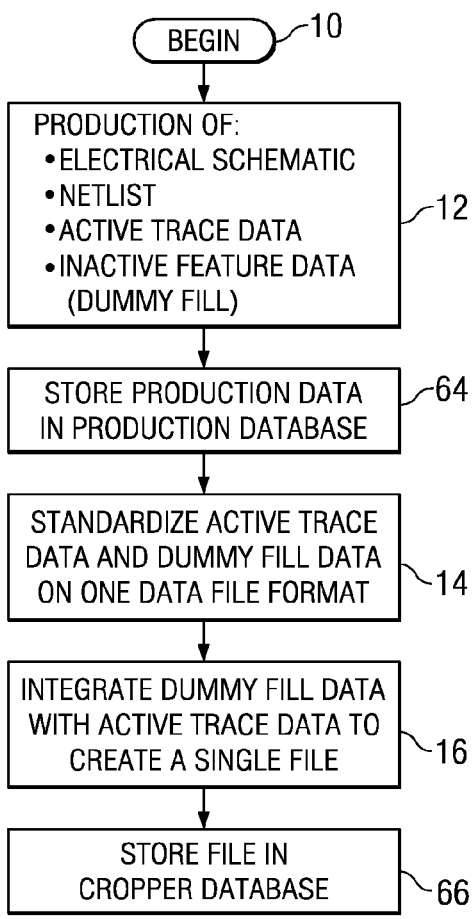
FIG. 5 is a flow chart depicting a methodology for use with a production environment.

FIG. 5 depicts an embodiment which specifies various production-related activities. The FIG. 5 embodiment begins 10 with the production of the electrical schematic netlist, active trace data, and dummy fill data 12 in accordance with the first embodiment. This production data can be stored 64 in the production database, for example the production database 62 depicted in FIG. 4. As with the first embodiment, the dummy fill and active trace data are standardized on one file format 14. Subsequently, the dummy fill data and active trace data are combined into one file 16. This data can then be stored in 66 in the cropper database, for example the cropper database 60 depicted in FIG. 4. This embodiment can then continue with viewing/optimizing the active trace data and dummy fill data using the system 50 of FIG. 4.

Figure 6:
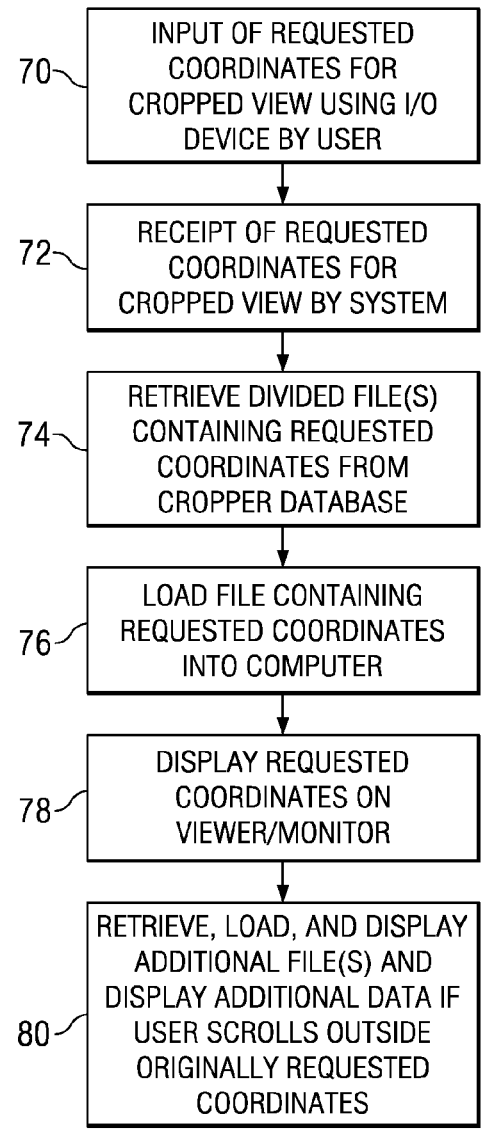
FIG. 6 is a flow chart depicting a methodology which occurs when a user scrolls through layout data.

FIG. 6 is a depiction of an embodiment of the invention during use of the divided files. Referring to FIGS. 4 and 6, a user inputs requested coordinates for viewing 70 into the system 50 using an I/O device 54. System 50 receives the request 72, then retrieves 74 and loads 76 one or more divided files containing the requested coordinates from the cropper database 60 into a computer of system 50. The data pertaining to the requested coordinates can be displayed 78 on the viewer/monitor 52. If, during viewing, the user scrolls outside the originally requested coordinates, system 50 retrieves, loads, and displays the files containing the additional data 80.

With the various embodiments of the present invention, costs are reduced because new equipment need not be purchased as frequently. This results from decreased demands placed on the hardware by the reduction of the amount of data which must be loaded. Only the data in the proximity of the area of interest can be accessed, which requires less time than loading all the layout data.

Various embodiments of the invention are also useful during initial device design. A new IC device design typically includes layout modules which have been used on prior IC device designs, as well as layout modules which are newly designed. Prior device design methods, for example those using an LVS tool, required completion of the entire database, including schematic, layout, and netlist, in order to run a characterization. This results from the difficulty in performing an accurate simulation using only a portion of a circuit layout which is limited to corresponding portions of the layout and netlist. Further, when device modules are designed simultaneously, the design is completed with some uncertainty of how the electrical characteristics of each module will affect other modules.

With another contemplated embodiment of the disclosed invention, the nets (i.e. the design layout data of circuit traces) can be named and the netlist completed prior to completing all layout modules. The netlist will define inputs for each layout module prior to completing each module. Using point-in values from the netlist, a particular layout module can be designed even though the other layout modules have not been completed. Further, an accurate simulation can be performed on the completed modules, for example using an LVS run, while other modules remain uncompleted, thus reducing the design cycle. As modules are completed, they can be included in the simulation to test their functionality and correlate their values to those of the schematic and the netlist.

Additionally, an embodiment of the invention can be used to handle either flat data and hierarchical data. In a flat format, the polygons of layout data can be stored under one cell (a flat format), while in a hierarchy, one highest cell stores cell references which may contain more polygons or more cells.

Other embodiments of the invention will be apparent to those skilled in the art from consideration of the specification and practice of the invention disclosed herein. It should be understood for example that every EDA vendor has their own particular combination of file types, so the file types and numbers discussed herein can be different, but they will likely have an equivalent for each EDA vendor. Further, each vendor can have a different hierarchy of files, so the description herein can be customized to provide the described functionality for particular software from various EDA vendors. It is intended that the specification and examples be considered as exemplary only, with a true scope and spirit of the invention being indicated by the following claims.

The invention claimed is:

1. A method, implemented with a computer system, used to provide semiconductor device design data for viewing, comprising:
   providing a schematic of a semiconductor device design, the schematic having a plurality of schematic devices;
   providing a netlist;
   providing a layout data comprising a three dimensional physical translation of the plurality of schematic devices of the semiconductor device design, wherein the three dimensional physical translation comprises a grid pitch, an offset of polygon structures, and a hierarchy;
   dividing the layout data into a plurality of subsets of layout data using a computer processor, wherein each subset of layout data comprises only a portion of the three dimensional physical translation;
   correlating each of the plurality of subsets of layout data using the computer processor such that the grid pitch and the offset of polygon structures of the three dimensional physical translation are maintained subsequent to the data correlation;

cross mapping each subset of layout data with the netlist using the computer processor to correlate leads of the three dimensional physical translation associated with each subset of layout data to leads of the schematic devices; and accessing at least one, but less than all, of the plurality of subsets of layout data to provide a view of the accessed subsets of layout data, while a remainder of the plurality of subsets of layout data remains correlated but unaccessed.

2. The method of claim 1 further comprising accessing only one of the plurality of subsets of layout data while all but one of the plurality of subsets of layout data remain unaccessed.

3. The method of claim 2 further comprising:
providing a .gds file corresponding to the layout data; and
dividing the .gds file into a plurality of .gds files, wherein each of the plurality of subsets of layout data corresponds to one .gds file of the plurality of .gds files.

4. The method of claim 1 further comprising:
maintaining the hierarchy of the three dimensional physical translation for complete cells within each subset of layout data; and
within each subset of layout data, altering the hierarchy of the three dimensional physical translation for partial cells divided to have a portion in more than one file by redefining each partial cell.

5. A computer system for implementing a method used to provide semiconductor device design data for viewing, comprising:
a computer processor coupled to a computer monitor and a memory;
wherein the computer processor is programmed for:
receiving a schematic of a semiconductor device design, the schematic having a plurality of schematic devices;
receiving a netlist;
receiving a layout data comprising a three dimensional physical translation of the plurality of schematic devices of the semiconductor device design, wherein the three dimensional physical translation comprises a grid pitch, an offset of polygon structures, and a hierarchy;

dividing the layout data into a plurality of subsets of layout data, wherein each subset of layout data comprises only a portion of the three dimensional physical translation;

correlating each of the plurality of subsets of layout data such that the grid pitch and the offset of polygon structures of the three dimensional physical translation are maintained subsequent to the data correlation;

cross mapping each subset of layout data with the netlist, using the computer processor, to correlate leads of the three dimensional physical translation associated with each subset of layout data to leads of the schematic devices; and accessing at least one, but less than all, of the plurality of subsets of layout data to provide a view of the accessed subsets of layout data on the computer monitor, while a remainder of the plurality of subsets of layout data remains correlated but unaccessed.

6. The computer system of claim 5, wherein the computer processor is further programmed for accessing only one of the plurality of subsets of layout data while all but one of the plurality of subsets of layout data remain unaccessed.

7. The method of claim 6, wherein the computer processor is further programmed for:
providing a .gds file corresponding to the layout data; and
dividing the .gds file into a plurality of .gds files, wherein each of the plurality of subsets of layout data corresponds to one .gds file of the plurality of .gds files.

8. The method of claim 5, wherein the computer processor is further programmed for:
maintaining the hierarchy of the three dimensional physical translation for complete cells within each subset of layout data; and
within each subset of layout data, altering the hierarchy of the three dimensional physical translation for partial cells divided to have a portion in more than one file by redefining each partial cell.

* * * * *